Sept. 22, 1964 H. P. DUPRE 3,149,893

AUXILIARY GROUND CONNECTION FOR A PRINTED CIRCUIT CONNECTOR

Filed Sept. 24, 1962

INVENTOR.
HENRY P. DUPRE
BY Howard A. Reiter
ATTORNEY 3,149,893

AUXILIARY GROUND CONNECTION FOR A PRINTED CIRCUIT CONNECTOR

Henry P. Dupre, Wilton, Conn., assignor to Burndy Corporation, a corporation of New York Filed Sept. 24, 1962, Ser. No. 225,651
7 Claims. (Cl. 339—14)

This invention relates to a connector for printed circuits and, more particularly, to such a connector provided with an auxiliary commoning connection.

Printed circuit boards having a plurality of electrical conductors often include, when in use, several conductors carrying identical voltages and polarity. These may be utilized for common grounding connections or for supplying common power to the components mounted to the board.

Individual connections to each of these printed circuit conductors are customarily separately positioned on a connector. In the usual printed circuit connector, possessing a limited number of contact positions, valuable space is wasted in providing separate contacts and lead-out wires for common conductors.

Accordingly, it is an object of the present invention to provide a commoning connection for selected conductors in a printed circuit.

Another object is to provide a standard form of bus bar for a printed circuit connector which may be modified by a simple procedure to accommodate a variety of printed circuit boards.

I accomplish these and other objects and obtain my new results as will be apparent from the device described in the following specification, particularly pointed out in the claims, and illustrated in the accompanying drawing in which:

Figures 1, 2, 3:
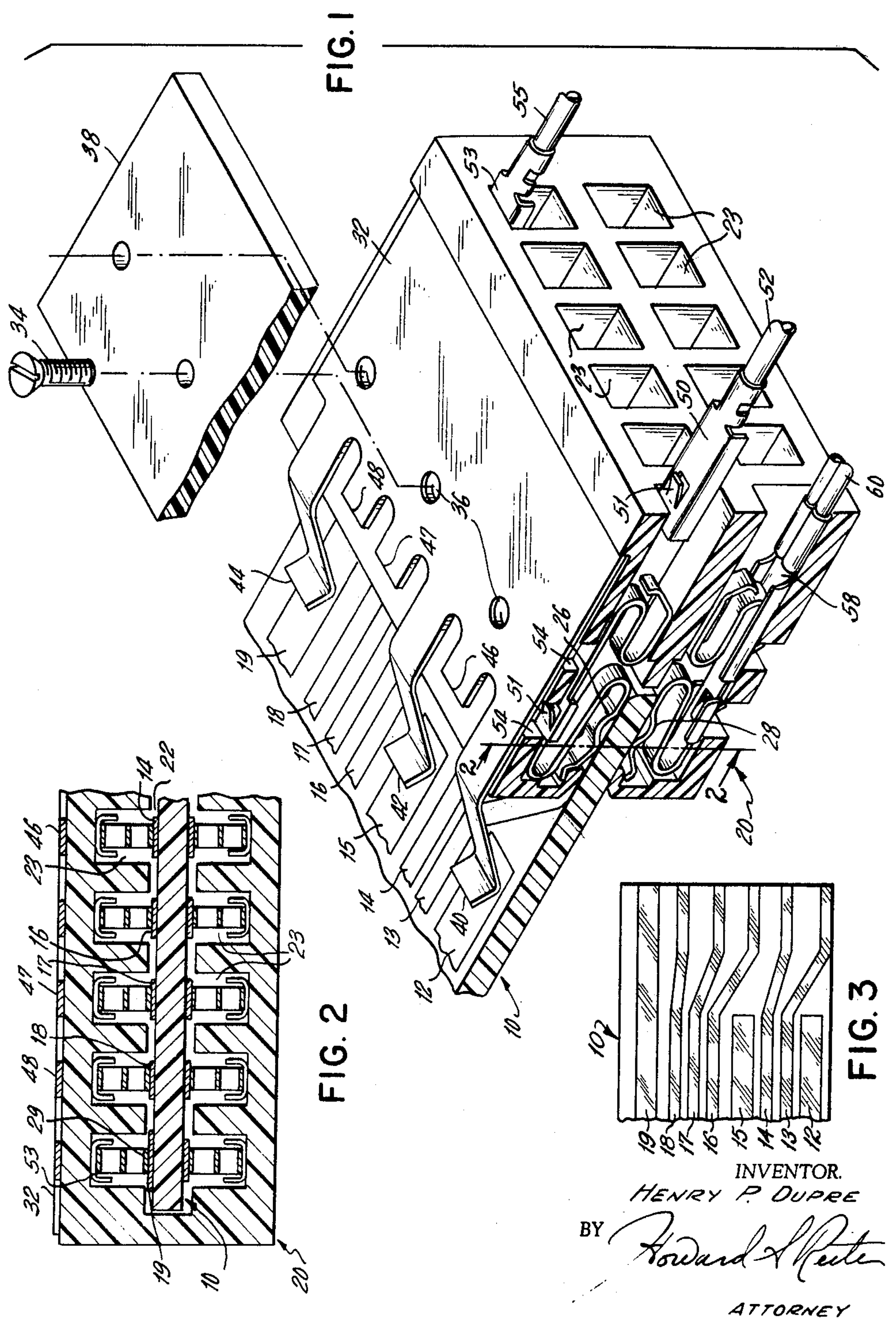
FIGURE 1 is a perspective, partly sectioned and exploded view of my connector containing a printed circuit board.
FIGURE 2 is a sectional view of the connector and board taken in the plane 2—2 of FIGURE 1.
FIGURE 3 is a reduced scale plan view of the circuit board of FIGURES 1 and 2.

Referring more in detail to the drawing, reference numeral 10 designates a printed circuit board upon which is printed various circuit conductors, such as 12 to 19 for example.

A connector having an insulating body 20 is provided therefor, the body having an elongated horizontal slot 22, into which the printed board is inserted. A plurality of parallel side by side vertical slots such as 23 intersect slot 22 and serve to seat and position socket spring contacts such as 26 and 28. The socket contacts resiliently engage the circuit conductors of the printed board, namely 13, 14, 16, 17, 18 and 19, which extend into the slot 22 and terminate close to the edge of the board. These may be called signal circuits. Printed conductors 12 and 15 which do not extend into the slot may, in the illustration given, be called grounding, common or non-signal circuits. For reasons discussed in the following, at least one conductor, 19, is considered as included among both the signal and common circuits.

The invention employs a special "commoning" bus bar 32, which may be mounted in a plane parallel to the board 10, and supported on the connector body 20 by suitable means, such as screw 34, to contact and interconnect the non-signal circuits. Screw 34 is threaded into an aperture 36 in the connector body.

An insulating plate 38 may be provided to cover the bus bar 32 on the connector body, and may be secured thereto by the same or other screws 34.

The bus bar is formed with a plurality of spring finger contacts such as 40, which may be greater in number than the number of printed conductors to be contacted in common. Individual fingers may then be selectively bent or removed so that the remaining fingers engage only the desired conductors. In the example given, spring finger contacts 40, 42 and 44 have been retained for engaging the grounding circuits 12, 15 and 19 respectively, and the remainder of the fingers have been broken off, leaving the stubs 46, 47 and 48. Conductors 12, 15 and 19 are thus electrically connected in common through their corresponding retained spring fingers, to the bus conductor 32. The bus is preferably formed of slightly resilient conductive material and is positioned so that the fingers form resilient cantilever arms with contacting surfaces at their free ends.

In the connector illustrated, socket contact 26 directly engages the printed circuit conductor 13 which is offset to pass around and directly under the spring finger contact 40 in line with conductor 12. The number of contacts which a connector may establish with a board of given width is thus greatly increased by establishing contact with two conductors in the transverse width of a single conductor. By providing commoning contacts 40, 42 and 44 extending in front of the signal circuit contacts such as socket contacts 26 and 28, it is possible to establish common connections prior to signal connections as the board is inserted. In many printed circuit uses this function is highly advantageous, and may in some cases be essential for proper circuit operation.

The socket springs are engaged by conductor terminals 50 positioned in the rear of slots 23 in the connector body. To complete the external connections to the circuit board, conductors 52 may be crimped to the terminals 50 in a known manner. The terminals and socket contacts may each be provided with spring detent fingers 51 adapted to engage openings 54 in the body 20 to lock them in assembled position. The design of similar socket contacts and conductor terminals is described in greater detail in co-pending United States Patent Application Serial Number 90,085, filed February 17, 1961.

To provide external connection to common circuits 12, 15 and 19, circuit conductor 19 extends beyond the tip of spring finger 44 into engagement with socket spring 29 (FIGURE 2) which is, in turn, electrically joined, through terminal 53, to external conductor lead 55. Conductor 19 is thus engaged by both common and signal circuit contacts, and an electrical path through conductor 55, terminal 53, socket contact 29, printed conductor 19, spring finger 44, and bus 32 is established. The spring finger contacts 40, 42, and 44, being integral parts of the bus bar 32, electrically join the ground circuits 12, 15 and 19, and each is accordingly grounded to single lead-out wires 55.

The remaining printed circuits 13, 14, 16, 17 and 18 are separately connected to their respective socket contacts such as 26 which are mated to their respective terminal connectors 50, and crimped-in conductor wires 52.

The board 10 may be printed on both sides as is illustrated in the figures of the drawing; and connections to the lower printed circuits 54 may be made through identical socket contacts 28, terminal connectors 58, and conductor wires 60.

The concept of an auxiliary set of contact fingers mounted parallel to a board as shown, or in any convenient position, for interconnecting printed circuit conductors may actually be extended beyond the single set shown, so that other series of bus bars may be insulatingly mounted over the set illustrated in any desired number. The auxiliary set of fingers may also be divided into sets of bus bars laterally positioned with respect to each other. Connectors employing the above described commoning bus bar permit substantial reductions in the complexity of printed circuit boards and connectors by making possible, for example, the use of a single lead-out wire for a plurality of separate conductors bearing common electrical signals.

I have thus described my invention, but I desire it understood that it is not confined to the particular forms shown and described, the same being merely illustrative, and that the invention may be carried out in other ways without departing from the spirit of my invention, and therefore I claim broadly the right to employ all equivalent instrumentalities coming within the scope of the appended claims, and by means of which objects of my invention are obtained and new results accomplished, since the particular embodiments herein shown and described are only some of the many that can be employed to obtain these objects and accomplish these results.

I claim:

1. A connector for a printed circuit board comprising: an insulating body having an opening for receiving a printed circuit board; individual contacts within the body adapted to individually engage printed circuit conductors on the board; means for electrically connecting the individual contacts to lead-out conductors extending from the connector; a bus bar mounted on the connector body having a plurality of integral extending finger contacts for engaging selected individual circuit conductors on the board, including circuit conductors not engaged by said individual contacts; and means for electrically connecting the bus bar to a lead-out conductor extending from the connector.

2. The connector of claim 1 wherein said means for connecting the bus bar to a lead-out conductor comprises means for connecting the bus bar to one of the individual contacts within the housing.

3. The connector of claim 1 wherein said means for connecting the bus bar to a lead-out conductor comprises an individual connection having a lead-out wire connected thereto; and an extending finger contact; said individual connection and said finger contact being adapted to engage the same printed circuit on the board.

4. The connector of claim 1 wherein the extending finger contacts are positioned to engage the printed circuit board prior to engagement of the board with the individual contacts, as the board is inserted into the connector.

5. The connector of claim 1 wherein the bus bar is mounted to the connector body in a plane parallel to the plane of the connected printed circuit board.

6. The connector of claim 1 wherein said integral extending finger contacts are individually removable.

7. An electrical connection comprising: a printed circuit board having a plurality of circuit conductors extending substantially normal to one edge thereof; said conductors including a first group terminating proximate the edge of said board and a second group terminating remote therefrom; at least one of said first group of conductors having an end portion disposed in axial alignment with an end portion of one of said second group; a connector for said board including an insulating body having an opening for receiving the board; a plurality of individual contacts within the body for engaging individual conductors of said first group; and a conductive bus bar mounted on said connector body having a plurality of extending finger contacts substantially aligned with said individual contacts for engaging selected conductors of both the first and the second groups.

References Cited in the file of this patent

UNITED STATES PATENTS 3,086,096 McGee ---------------- Apr. 16, 1963

FOREIGN PATENTS 849,078 Great Britain ---------- Sept. 21, 1960